(12) United States Patent
Wu et al.

(10) Patent No.: US 10,939,574 B2
(45) Date of Patent: Mar. 2, 2021

(54) SERVER APPARATUS AND TRAY MECHANISM THEREOF

(71) Applicant: Wistron Corporation, New Taipei (TW)

(72) Inventors: Long-Hua Wu, New Taipei (TW); Chi-Ken Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/558,173

(22) Filed: Sep. 2, 2019

(65) Prior Publication Data
US 2020/0396858 A1 Dec. 17, 2020

(30) Foreign Application Priority Data
Jun. 14, 2019 (CN) .......................... 201910516477.8

(51) Int. Cl.
| | |
|---|---|
| H05K 7/00 | (2006.01) |
| H05K 7/14 | (2006.01) |
| E05B 13/10 | (2006.01) |
| E05C 9/02 | (2006.01) |

(52) U.S. Cl.
CPC .......... *H05K 7/1489* (2013.01); *E05B 13/10* (2013.01); *E05C 9/02* (2013.01); *H05K 7/1411* (2013.01)

(58) Field of Classification Search
None
See application file for complete search history.

(56) References Cited

U.S. PATENT DOCUMENTS

| | | | | | |
|---|---|---|---|---|---|
| 5,340,340 | A | * | 8/1994 | Hastings | G06F 1/181 312/223.1 |
| 5,673,172 | A | * | 9/1997 | Hastings | G06F 1/182 361/679.34 |
| 6,252,514 | B1 | * | 6/2001 | Nolan | G06F 1/183 340/686.4 |
| 6,456,489 | B1 | * | 9/2002 | Davis | G06F 1/184 312/332.1 |
| 7,280,352 | B2 | * | 10/2007 | Wilson | G06F 1/184 312/223.1 |
| 7,460,365 | B2 | * | 12/2008 | Morris | G06F 1/187 361/679.33 |
| 7,513,783 | B2 | * | 4/2009 | Okuda | H01R 13/62955 439/157 |
| 8,405,966 | B2 | * | 3/2013 | Hartman | G06F 1/186 361/679.31 |
| 8,908,388 | B2 | * | 12/2014 | Chen | G06F 1/184 361/802 |

(Continued)

*Primary Examiner* — Anthony Q Edwards
*Assistant Examiner* — Rashen E Morrison
(74) *Attorney, Agent, or Firm* — Winston Hsu

(57) ABSTRACT

A server apparatus includes a casing having an opening and a fixing structure away from the opening, a tray mechanism and a server module. The tray mechanism includes a tray, a transmission member slidably disposed on the tray and having a slot, a link having an engaging structure and being slidably disposed through the slot, and a handle movably connected to the transmission member and pivoted to the tray. The server module is disposed on the tray. When the tray is disposed in the casing and the handle pivots to a mounting position, the transmission member slides relative to the tray to drive the link to pivot, so as to rotate the engaging structure to be engaged with the fixing structure.

20 Claims, 7 Drawing Sheets

(56) References Cited

U.S. PATENT DOCUMENTS

| | | | |
|---|---|---|---|
| 9,706,688 B2 * | 7/2017 | Smith | G06F 1/185 |
| 9,727,099 B1 * | 8/2017 | Hastings | G06F 1/187 |
| 10,638,631 B2 * | 4/2020 | O'Leary | H05K 7/1409 |
| 2016/0064040 A1 * | 3/2016 | Hartman | G06F 1/20 |
| | | | 360/97.12 |

* cited by examiner

SERVER APPARATUS AND TRAY MECHANISM THEREOF

BACKGROUND OF THE INVENTION

1. Field of the Invention

The present disclosure relates to a server apparatus and a tray mechanism thereof, and more specifically, to a server apparatus utilizing a handle to fix a server module on a casing and a tray mechanism thereof.

2. Description of the Prior Art

In a conventional server assembly process, a server module including related server components (e.g. display cards and mainboards) is mounted on a tray first, and then the tray having the server module disposed thereon is inserted into a server casing through a front opening of the server casing. As such, the server assembly process can be completed quickly and conveniently.

However, during the process of inserting the tray into the server casing, the prior art usually adopts the one-sided engagement design that a handle at a front end of the tray is utilized to engage with an engaging structure on a side plate of the server casing for fixing the tray on the server casing and driving the server module to connect to connection ports in the server casing. However, in the one-sided engagement design, the server module may easily be oblique relative to the server casing due to one-sided uneven engagement of the tray with the server casing, causing jamming of the server module in the server casing. Furthermore, since the server module is usually long to make an engaging position where the handle is engaged with the side plate far away from a connection position where the server module is coupled to the connection ports in the server casing, it may cause deformation of the server module and poor electrical contact between the server module and the connection ports.

SUMMARY OF THE INVENTION

The present disclosure provides a server apparatus including a casing, a tray mechanism, and at least one server module. The casing has an opening and a first fixing structure away from the opening. The tray mechanism includes a tray, a transmission member, a first link, and a handle. The tray has a holding portion. The transmission member is slidably disposed on the tray. The transmission member has a front portion and a rear portion. The rear portion has a first slot. The first link has a first shaft portion and a first driven portion. The first shaft portion is pivoted to the holding portion and has a first engaging structure. The first driven portion is slidably disposed through the first slot. The handle has a pivot portion and a driving portion movably connected to the front portion. The pivot portion is pivoted to the holding portion to make the handle pivotable between a releasing position and a mounting position relative to the tray. The at least one server module is disposed on the holding portion. When the tray is disposed in the casing and the handle pivots to the mounting position, the transmission member slides relative to the holding portion to pivot the first link for rotating the first engaging structure to be engaged with the first fixing structure.

The present disclosure further provides a tray mechanism applied to assembly of at least one electronic module and a casing. The casing has an opening and a first fixing structure away from the opening. The tray mechanism includes a tray, a transmission member, a first link, and a handle. The tray has a holding portion. The at least one electronic module is disposed on the holding portion. The transmission member is slidably disposed on the tray. The transmission member has a front portion and a rear portion. The rear portion has a first slot. The first link has a first shaft portion and a first driven portion. The first shaft portion is pivoted to the holding portion and has a first engaging structure. The first driven portion is slidably disposed through the first slot. The handle has a pivot portion and a driving portion movably connected to the front portion. The pivot portion is pivoted to the holding portion to make the handle pivotable between a releasing position and a mounting position relative to the tray. When the tray is disposed in the casing and the handle pivots to the mounting position, the transmission member slides relative to the holding portion to pivot the first link for rotating the first engaging structure to be engaged with the first fixing structure.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
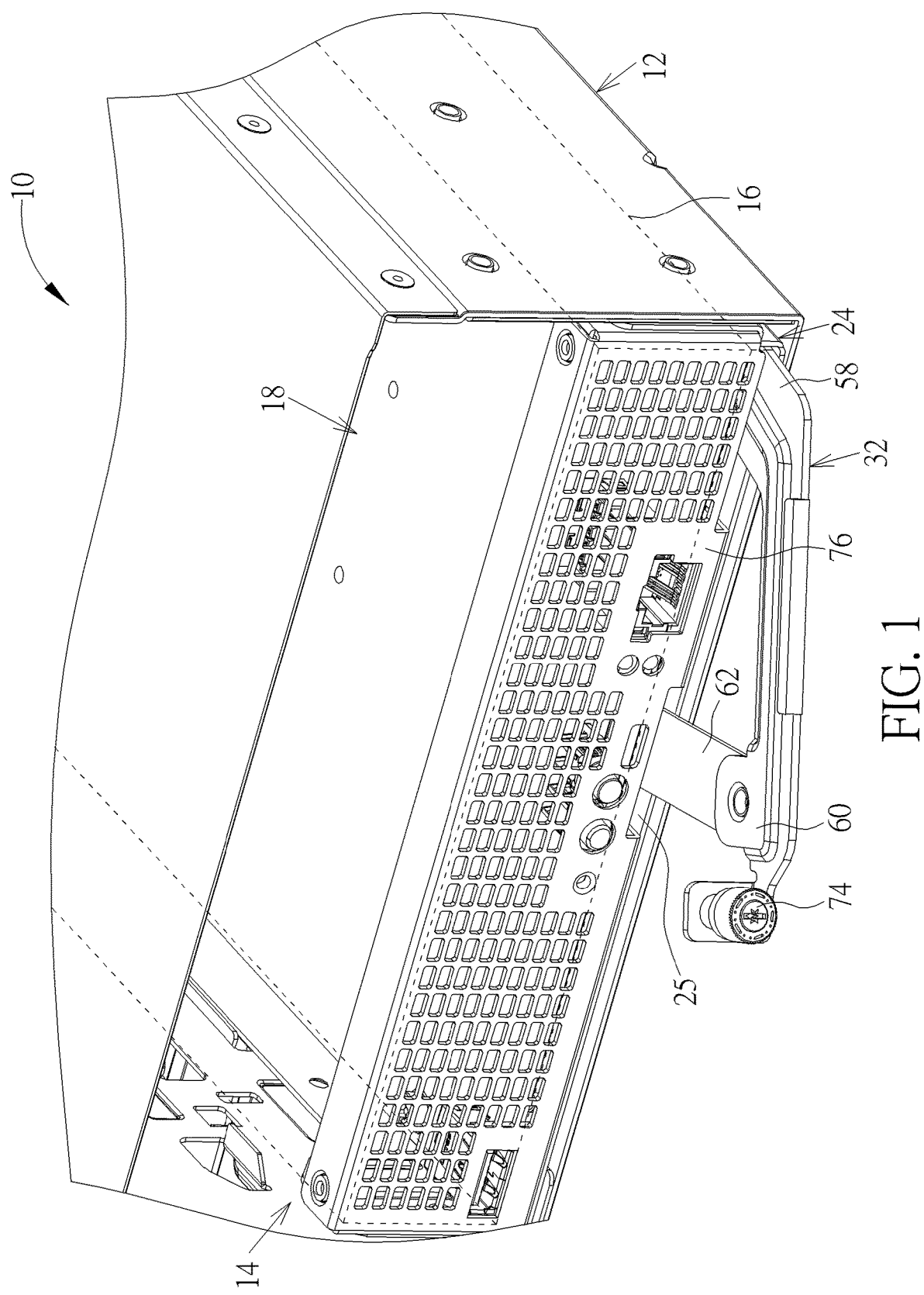
FIG. 1 is a partial enlarged diagram of a server apparatus according to an embodiment of the present disclosure.
Figure 2:
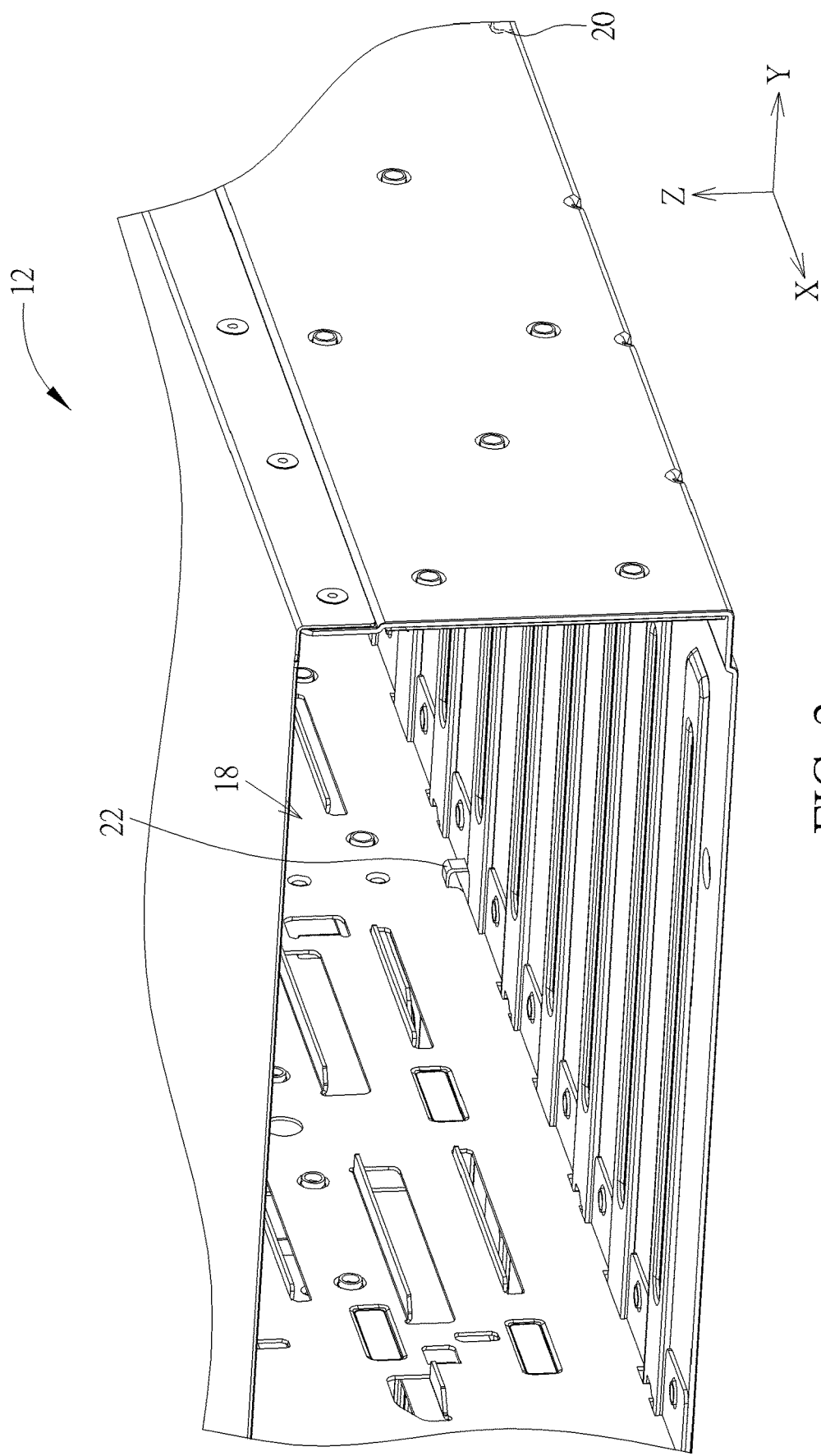
FIG. 2 is a partial enlarged diagram of a casing in FIG. 1.

Please refer to FIG. 1 and FIG. 2. FIG. 1 is a partial enlarged diagram of a server apparatus 10 according to an embodiment of the present disclosure. FIG. 2 is a partial enlarged diagram of a casing 12 in FIG. 1. As shown in FIG. 1 and FIG. 2, the server apparatus 10 includes the casing 12, a tray mechanism 14, and at least one server module 16 (one shown in FIG. 1 and briefly depicted by dotted lines, but not limited thereto). That is, the tray mechanism 14 of the present disclosure is applied to assembly of the server module 16 and the casing 12, but not limited thereto, meaning that the tray mechanism 14 could be applied to assembly of the casing 12 and other electronic module (e.g. a hard disk array module) and the related description could be reasoned by analogy according to the following description and figures. The casing 12 has an opening 18, a first fixing structure 20, and a second fixing structure 22 opposite to the first fixing structure 20. The first fixing structure 20 and the second fixing structure 22 are formed on the casing 12 away from the opening 18 (e.g. the first fixing structure 20 could be formed at a middle section of the casing, but not limited thereto). In this embodiment, the first fixing structure 20 and the second fixing structure 22 could be an engaging sheet bending from a side of the casing 12, but not limited thereto, meaning that the present disclosure could adopt other fixing design, such as the design of disposing a fixing pillar on a side of the casing. As for which design is adopted, it depends on the practical application of the present disclosure.

Figure 3:
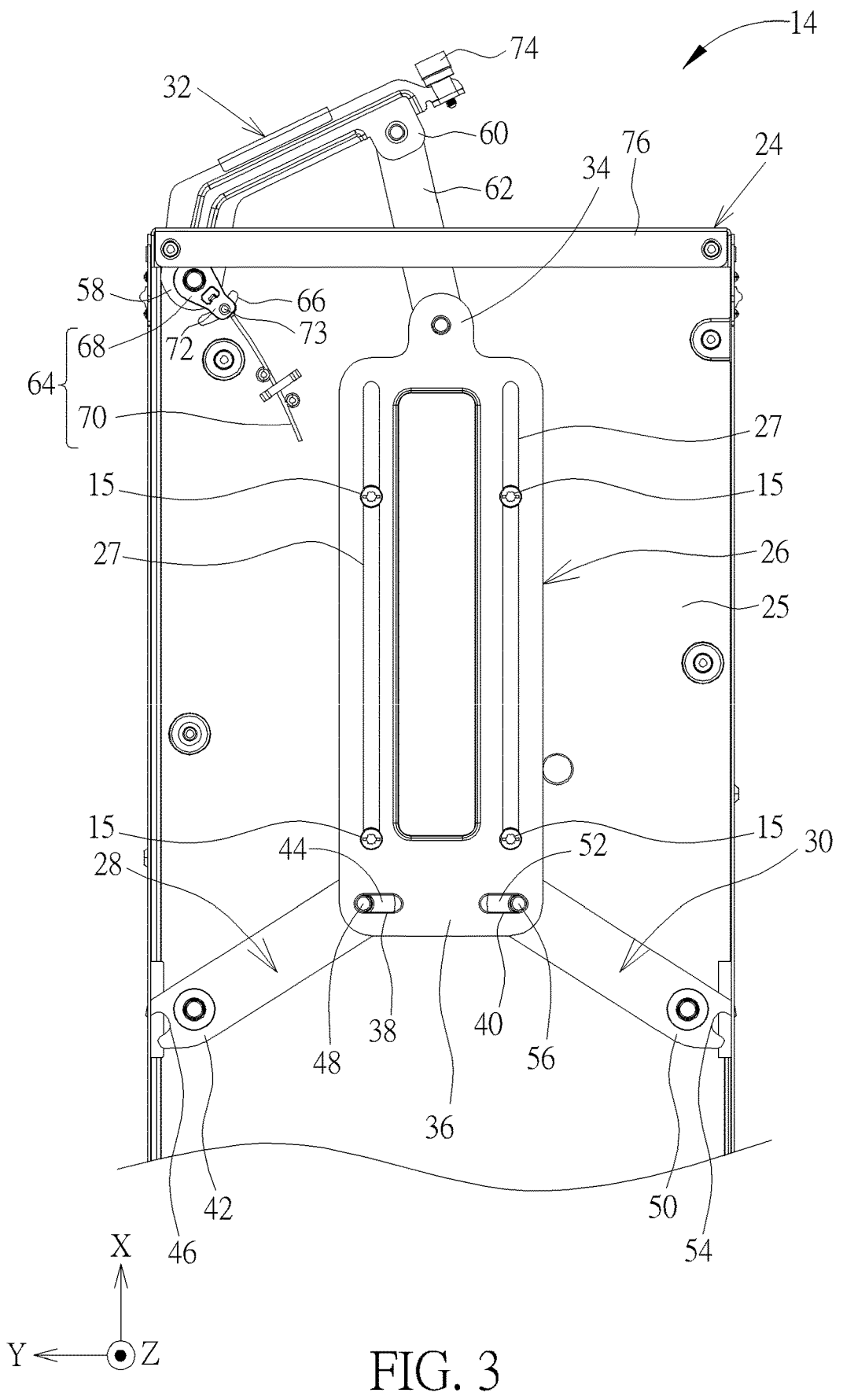
FIG. 3 is a top view of a tray mechanism in FIG. 1.
Figure 4:
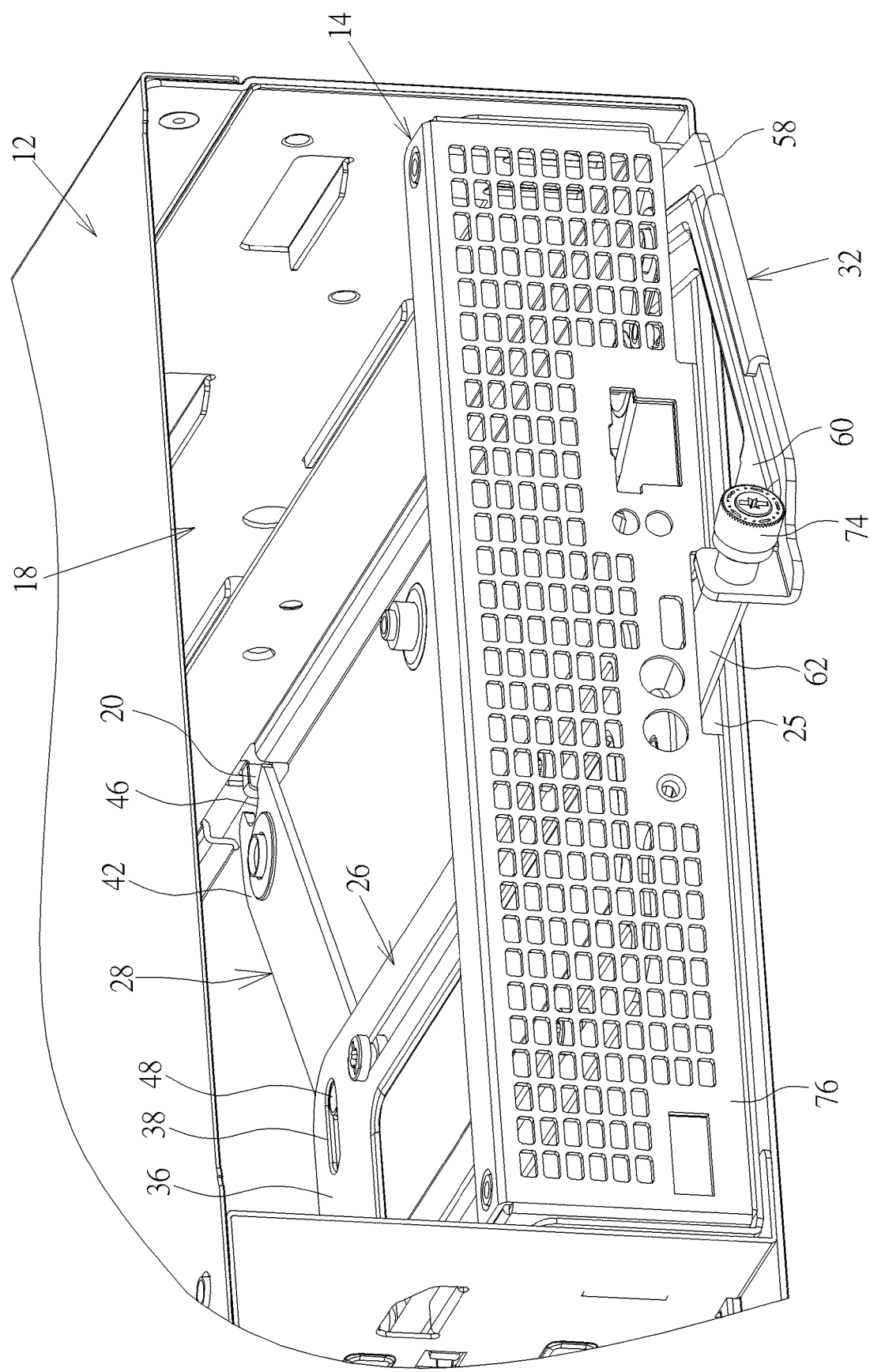
FIG. 4 is a diagram showing the tray mechanism in FIG. 1 has been not fixed on the casing.

The mechanical design of the tray mechanism 14 is as shown in FIG. 1, FIG. 3, and FIG. 4. FIG. 3 is a top view of the tray mechanism 14 in FIG. 1. FIG. 4 is a diagram showing the tray mechanism 14 in FIG. 1 has been not fixed on the casing 12. As shown in FIG. 1, FIG. 3, and FIG. 4, the tray mechanism 14 includes the tray 24, a transmission member 26, a first link 28, a second link 30, and a handle 32. The tray 24 has a holding portion 25. The server module 16 is disposed on the holding portion 25. The transmission member 26 is slidable along an X-axis (but not limited thereto) on the holding portion 25 and has a front portion 34 and a rear portion 36. The rear portion 36 has a first slot 38 and a second slot 40. In this embodiment, the transmission member 26 could be slidably disposed on the holding portion 25 by a pillar-to-slot sliding design, but the present disclosure is not limited thereto, meaning that the present disclosure could adopt other sliding design, such as a block-to-slot sliding design. For example, as shown in FIG. 3, the tray mechanism 14 could utilize at least one screw 15 to penetrate through a corresponding longitudinal slot 27 on the transmission member 26 (for example, as shown in FIG. 3, the tray mechanism 14 may have four screws 15 for penetrating through two longitudinal slots 27 respectively, but the present disclosure is not limited thereto) for disposing the transmission member 26 on the holding portion 25. In such a manner, when the screw 15 slides along the longitudinal slot 27, the transmission member 26 can slide longitudinally on the holding portion 25.

The first link 28 has a first shaft portion 42 and a first driven portion 44. The first shaft portion 42 is pivoted to the holding portion 25 and has a first engaging structure 46 (preferably a hook, but the present disclosure is not limited thereto). The first driven portion 44 is slidably disposed through the first slot 38. In this embodiment, the first driven portion 44 preferably has a first pillar 48. The first pillar 48 is slidably disposed through the first slot 38. Similarly, the second link 30 has a second shaft portion 50 and a second driven portion 52. The second shaft portion 50 is pivoted to the holding portion 25 and has a second engaging structure 54 (preferably a hook, but the present disclosure is not limited thereto). The second driven portion 52 preferably has a second pillar 56. The second pillar 56 is slidably disposed through the second slot 40. As such, via sliding of the transmission member 26 along the X-axis, the first link 28 and the second link 30 take the first shaft portion 42 and the second shaft portion 50 as a rotating center respectively to be pivotable on the holding portion 25.

The handle 32 has a pivot portion 58 and a driving portion 60. The driving portion 60 is movably connected to the front portion 34. The pivot portion 58 is pivoted to the holding portion 25 to make the handle 32 pivotable between a releasing position and a mounting position. To be more specific, in this embodiment, the server apparatus 10 could further include a transmission link 62 pivoted to the driving portion 60 of the handle 32 and the front portion 34 of the transmission member 26, such that the driving portion 60 could drive the transmission member 26 to slide longitudinally on the holding portion 25 via the transmission link 62.

In practical application, the tray mechanism 14 could further include a torsion spring structure 64. The torsion spring structure 64 is connected to the pivot portion 58 of the handle 32 and the holding portion 25 for providing an elastic force to the pivot portion 58, so as to drive the handle 32 to pop out relative to the tray 24. In this embodiment, an arc-shaped slot 66 could be formed on the holding portion 25, and the torsion spring structure 64 could include a bridge sheet 68 and a torsion spring 70. The bridge sheet 68 is fixed to the pivot portion 58 and has a protruding member 72 movably disposed through the arc-shaped slot 66 (e.g. via the design that the protruding member 72 has a pillar 73 to be movably disposed through the arc-shaped slot 66 as shown in FIG. 3, but not limited thereto). The torsion spring 70 is connected to the holding portion 25 and the protruding member 72 respectively. Accordingly, when the handle 32 pivots inward relative to the tray 24, the bridge sheet 68 could rotate with the pivot portion 58 to slide the protruding member 72 along the arc-shaped slot 66 for biasing the torsion spring 70. In such a manner, the torsion spring 70 can provide the elastic force for driving the handle 32 to pop out relative to the tray 24, such that a user could release the tray mechanism 14 more quickly and smoothly.

Furthermore, the tray mechanism 14 could further include a locking structure 74 and a front panel 76. In this embodiment, the locking structure 74 could be a screw as shown in FIG. 3 (but not limited thereto) and is connected to the driving portion 60 of the handle 32. The front panel 76 is disposed on the holding portion 25 corresponding to the opening 18 and could be a port panel commonly applied to a server for providing space needed for mounting of front connection ports (e.g. a USB (Universal Serial Bus) port and a network port) of the server module 16. Accordingly, when the handle 32 pivots to the mounting position, the locking structure 74 could be detachably locked on the front panel 76 for fixing the handle 32 at the mounting position, such that the tray mechanism 14 could be mounted on the casing 12 more steadily. To be noted, the design for fixing the handle 32 at the mounting position via the locking structure 74 is not limited to the aforesaid embodiment, meaning that the present disclosure could adopt the design for directly locking the handle 32 on the tray 24. For example, in another embodiment, the locking structure 74 could be directly locked on a locking sheet bending from the tray 24. Moreover, the second link 30, the torsion spring structure 64 and the locking structure 74 could be omissible for simplifying the tray mechanical design of the server apparatus of the present disclosure.

Figure 5:
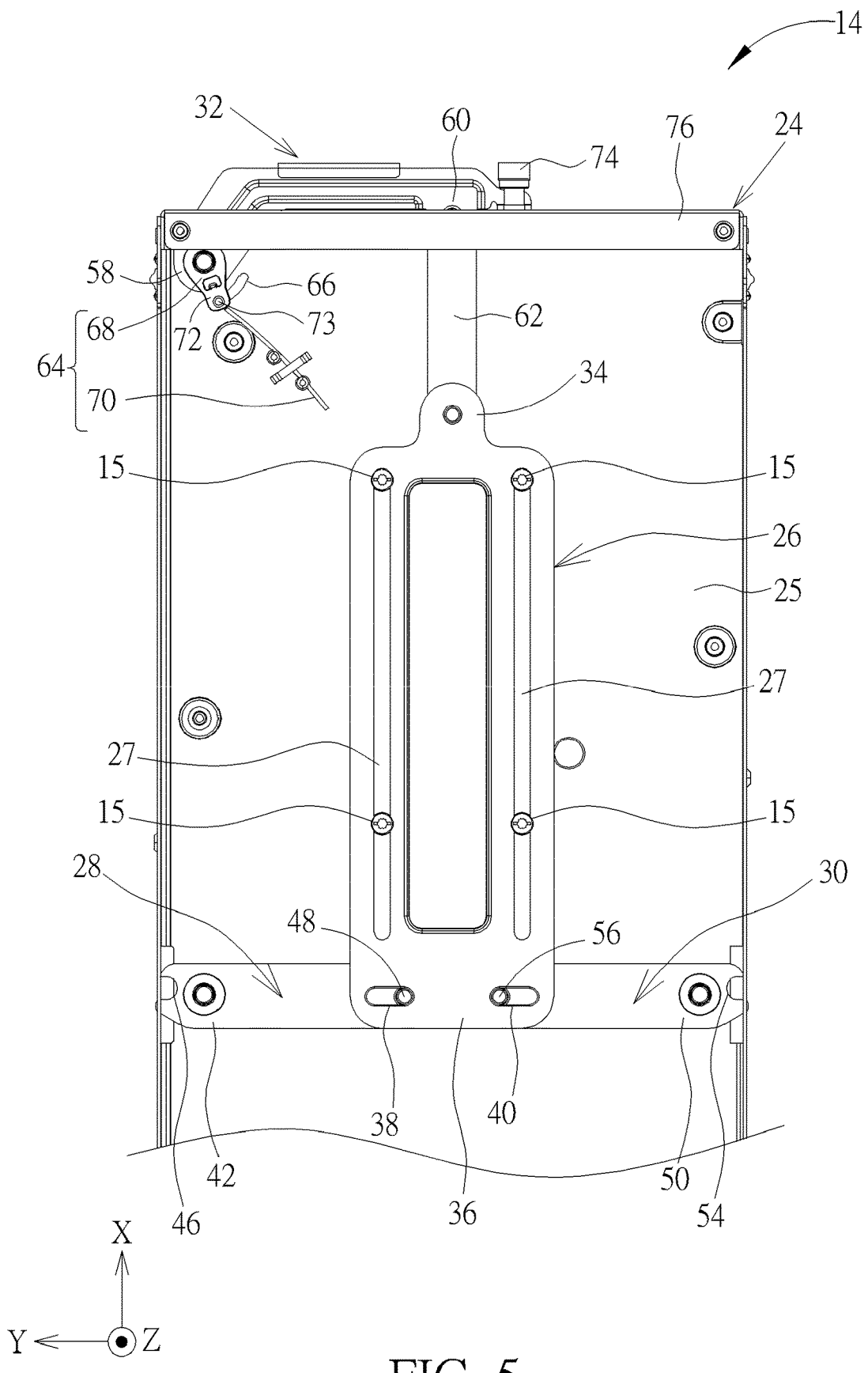
FIG. 5 is a top view of the tray mechanism in FIG. 3 when a handle pivots to a mounting position.
Figure 6:
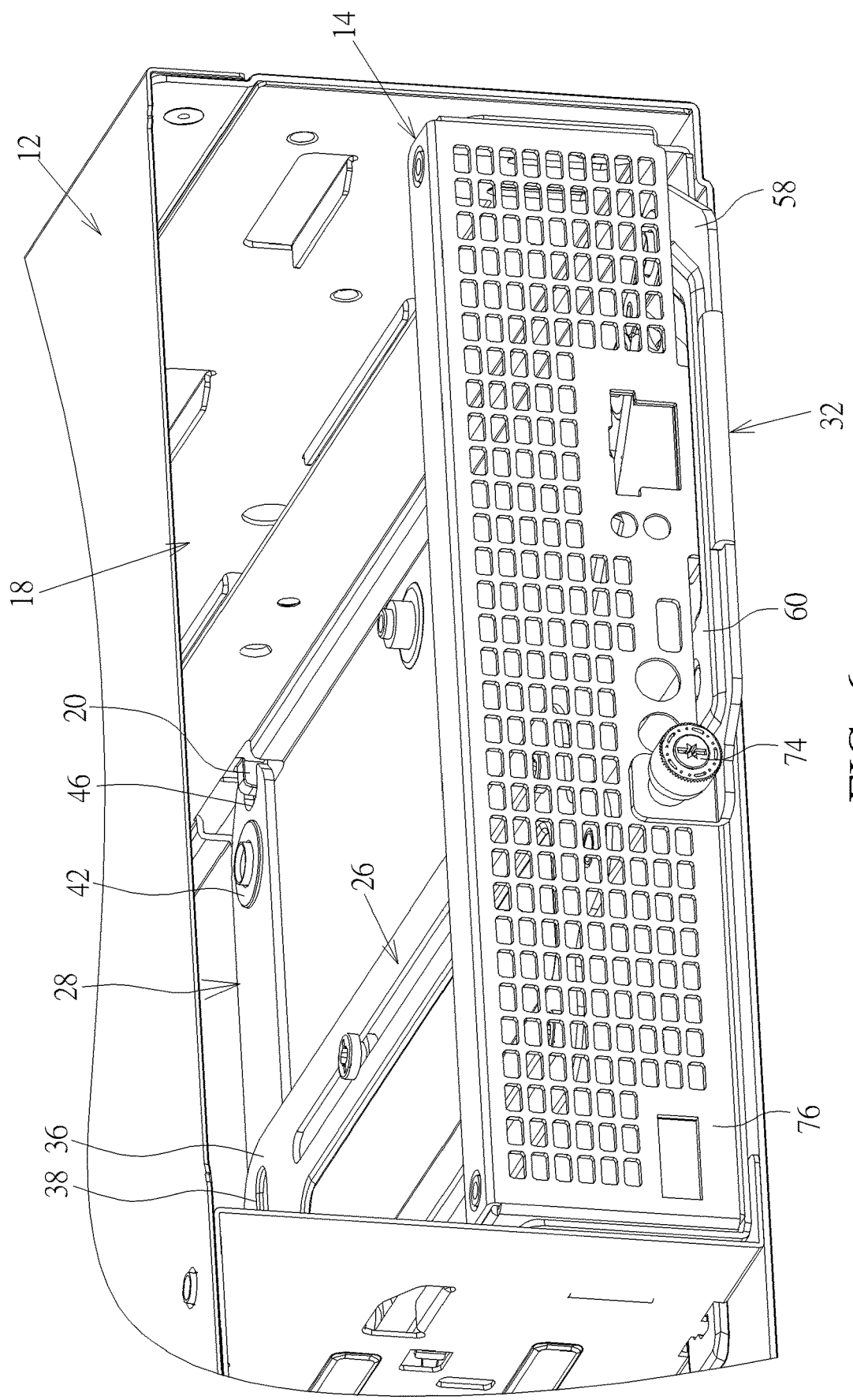
FIG. 6 is a diagram of a first engaging structure in FIG. 4 rotating to be engaged with a first fixing structure.

More detailed description for the assembly operation of the server apparatus 10 is provided as follows. Please refer to FIG. 3, FIG. 4, FIG. 5, and FIG. 6. FIG. 5 is a top view of the tray mechanism 14 in FIG. 3 when the handle 32 pivots to the mounting position. FIG. 6 is a diagram of the first engaging structure 46 in FIG. 4 rotating to be engaged with the first fixing structure 20. As shown in FIGS. 3-6, when the user wants to perform the assembly operation of the server apparatus 10, the user just needs to insert the tray mechanism 14 having the server module 16 mounted thereon into the casing 12 through the opening 18 until the first engaging structure 46 and the second engaging structure 54 abut against the first fixing structure 20 and the second fixing structure 22 respectively (only abutting of the first engaging structure 46 against the first fixing structure 20 is shown in FIG. 4 due to the viewing angle, and the related description for abutting of the second engaging structure 54 against the second fixing structure 22 could be reasoned by analogy). Subsequently, the user could pivot the handle 32 inward to the mounting position as shown in FIG. 5 relative to the tray 24. As such, the driving portion 60 of the handle 32 could drive the transmission member 26 from a position as shown in FIG. 3 backward to a position as shown in FIG. 5 along the X-axis via the transmission link 62. During this process, via backward sliding of the transmission member 26, the first slot 38 and the second slot 40 drive the first link 28 and the second link 30 via the first pillar 48 and the second pillar 56 respectively to pivot backward relative to the tray 24, so as to rotate the first engaging structure 46 and the second engaging structure 54 against the first fixing structure 20 and the second fixing structure 22 respectively to a position as shown in FIG. 5. In such a manner, the first engaging structure 46 and the second engaging structure 54 could be engaged with the first fixing structure 20 and the second fixing structure 22 respectively (only engagement of the first engaging structure 46 with the first fixing structure 20 is shown in FIG. 6 due to the viewing angle, and the related description for engagement of the second engaging structure 54 with the second fixing structure 22 could be reasoned by analogy).

Accordingly, the first engaging structure 46 and the second engaging structure 54 can rotate against the first fixing structure 20 and the second fixing structure 22 to generate corresponding leverage torques (respectively taking a position where the first link 28 is pivoted to the holding portion 25 and a position where the second link 30 is pivoted to the holding portion 25 as leverage fulcrums), such that the user can operate the handle 32 smoothly to move the tray 24 backward relative to the casing 12 and fix the tray 24 on the casing 12 via the two-sided engagement design that the first engaging structure 46 and the second engaging structure 54 are engaged with the first fixing structure 20 and the second fixing structure 22 respectively. After the user utilizes the locking structure 74 to lock the handle 32 on the front panel 76, the tray mechanism 14 can be fixed on the casing 12 firmly (at this time, the torsion spring 70 is biased to a position as shown in FIG. 5 correspondingly), so as to complete the assembly operation of the server apparatus 10.

On the other hand, when the user wants to perform the disassembly operation of the server apparatus 10, the user just needs to release locking between the locking structure 74 and the front panel 76 and then pivot the handle 32 outward relative to the tray 24. At this time, the biased torsion spring 70 could provide elastic force to drive the handle 32 to pop out. As such, the user could pivot the handle 32 outward to the releasing position as shown in FIG. 3 quickly and smoothly, so as to drive the transmission member 26 from the position as shown in FIG. 6 forward to the position as shown in FIG. 3 along the X-axis via the transmission link 62. During this process, via forward sliding of the transmission member 26, the first slot 38 and the second slot 40 can drive the first link 28 and the second link 30 respectively to pivot forward relative to the tray 24, so as to rotate the first engaging structure 46 and the second engaging structure 54 against the first fixing structure 20 and the second fixing structure 22 respectively to the position as shown in FIG. 3. In such a manner, engagement of the first engaging structure 46 with the first fixing structure 20 and engagement of the second engaging structure 54 with the second fixing structure 22 could be released.

Accordingly, the first engaging structure 46 and the second engaging structure 54 can rotate against the first fixing structure 20 and the second fixing structure 22 to generate corresponding leverage torques, such that the user can operate the handle 32 smoothly to move the tray 24 forward relative to the casing 12 and release the aforesaid two-sided engagement at the same time. At this time, since the first engaging structure 46 and the second engaging structure 54 are no longer engaged with the first fixing structure 20 and the second fixing structure 22 as shown in FIG. 4, the user could continue pulling the handle 32 to detach the tray mechanism 14 having the server module 16 disposed thereon from the casing 12 for the subsequent related operation (e.g. replacement or maintenance of the server module 16).

In summary, the present disclosure adopts the leverage driving design that the linkage mechanism formed by the handle, the transmission member, and the link is engaged with or disengaged from the fixing structure of the casing, to allow that the user could insert the tray mechanism into the casing or detach the tray mechanism from the casing quickly and smoothly by simply pushing or pulling the handle. Thus, the present disclosure can improve assembly and disassembly convenience of the server apparatus.

Furthermore, via the two-sided engagement design that the aforesaid links are engaged with the fixing structures away from the opening of the casing, the present disclosure not only solves the prior art problem that the server module may easily be oblique relative to the server casing due to one-sided uneven engagement of the tray with the server casing, but also avoids deformation of the server module and poor electrical contact between the server module and the connection ports in the casing, so as to improve the assembly efficiency and quality of the server apparatus and surely prevent damage of the server module during the server assembly process.

Figure 7:
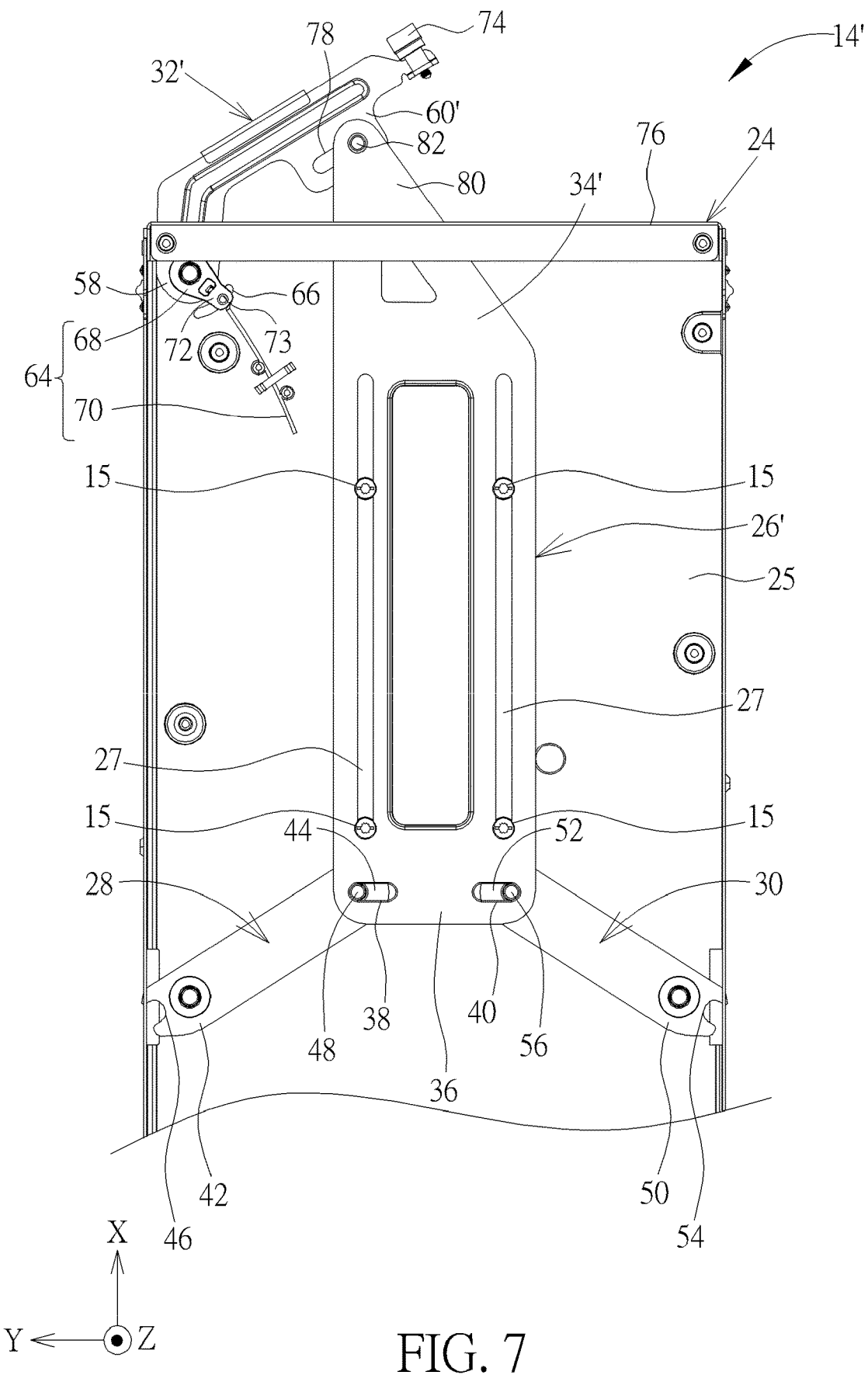
FIG. 7 is a top view of a tray mechanism according to another embodiment of the present disclosure.

It should be mentioned that the linkage design for the handle and the transmission member is not limited to the aforesaid embodiment, meaning that the present disclosure could adopt the linkage design that the handle is directly connected to the transmission member without the transmission link in another embodiment. For example, please refer to FIG. 7, which is a top view of a tray mechanism 14' according to another embodiment of the present disclosure. Components both mentioned in this embodiment and the aforesaid embodiments represent components with similar structures or functions, and the related description is omitted herein. As shown in FIG. 7, the tray mechanism 14' includes the tray 24, the first link 28, the second link 30, the torsion spring structure 64, the locking structure 74, the front panel 76, a transmission member 26', and a handle 32'. The handle 32' has the pivot portion 58 and a driving portion 60'. The driving portion 60' has a driving slot 78. The transmission member 26' has a front portion 34' and the rear portion 36. A connection sheet portion 80 extends from the front portion 34' toward the driving slot 78 and has a driven pillar 82 movably disposed through the driving slot 78. In such a manner, when the handle 32' pivots inward or outward relative to the tray 24, the driven pillar 82 slides along the driving slot 78 to slide the transmission member 26' backward or forward along the X-axis as shown in FIG. 7 with pivoting of the handle 32'. That is to say, the present disclosure adopts the linkage design that the handle is directly connected to the transmission member, to allow that the user could perform the assembly and disassembly operations of the server apparatus quickly and smoothly by simply pushing or pulling the handle. Thus, the present disclosure can improve assembly and disassembly convenience of the server apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server apparatus comprising:
   a casing having an opening and a first fixing structure away from the opening;
   a tray mechanism comprising:
      a tray having a holding portion;
      a transmission member slidably disposed on the tray along a longitudinal center line of the holding portion, the transmission member having a front portion and a rear portion, the rear portion having a first slot;
      a first link having a first shaft portion and a first driven portion, the first shaft portion being pivoted to the holding portion and having a first engaging structure, the first driven portion being slidably disposed through the first slot; and
      a handle having a pivot portion and a driving portion movably connected to the front portion, the pivot portion being pivoted to a corner area of the holding portion to make a pivotal connection position of the handle and the holding portion away from the transmission member at a lateral distance relative to the longitudinal center line and make the handle pivotable between a releasing position and a mounting position relative to the tray, the transmission member sliding relative to the holding portion with pivoting of the handle to the mounting position via the pivot portion to pivot the first link for rotating the first engaging structure to be engaged with the first fixing structure; and
   at least one server module disposed on the holding portion.

2. The server apparatus of claim 1, wherein the tray mechanism further comprises:
   a transmission link pivoted to the driving portion and the front portion respectively to make the driving portion drive the transmission link to slide via pivoting of the transmission link.

3. The server apparatus of claim 1, wherein the driving portion has a driving slot, a connection sheet portion extends from the front portion toward the driving slot, the connection sheet portion has a driven pillar corresponding to the driving slot, the driven pillar is movably disposed through the driving slot, and when the handle pivots to the mounting position, the driven pillar slides along the driving slot to make the transmission member slide relative to the holding portion with pivoting of the handle.

4. The server apparatus of claim 1, wherein the casing further has a second fixing structure opposite to the first fixing structure, the rear portion has a second slot, and the tray mechanism further comprises:
   a second link having a second shaft portion and a second driven portion, the second shaft portion being pivoted to the holding portion and having a second engaging structure, the second driven portion being slidably disposed through the second slot;
   wherein when the handle pivots to the mounting position, the first slot and the second slot drive the first link and the second link to rotate relative to the holding portion via the first driven portion and the second driven portion respectively, for rotating the first engaging structure and the second engaging structure to be engaged with the first fixing structure and the second fixing structure respectively, so as to move the tray to be fixed on the casing.

5. The server apparatus of claim 1, wherein the tray mechanism further comprises:
   a torsion spring structure connected to the pivot portion and the holding portion, for providing an elastic force to drive the handle to pop out relative to the tray.

6. The server apparatus of claim 5, wherein an arc-shaped slot is formed on the holding portion, and the torsion spring structure comprises:
   a bridge sheet fixed to the pivot portion and having a protruding member, the protruding member being movably disposed through the arc-shaped slot; and
   a torsion spring connected to the holding portion and the protruding member respectively;
   wherein when the handle pivots inward relative to the tray, the bridge sheet pivots with the pivot portion to slide the protruding member along the arc-shaped slot for biasing the torsion spring.

7. The server apparatus of claim 1, wherein the tray mechanism further comprises a front panel disposed on the holding portion corresponding to the opening, and the handle is detachably locked on the front panel to be fixed at the mounting position when the handle pivots to the mounting position.

8. The server apparatus of claim 1, wherein the tray mechanism further comprises:
   a locking structure connected to the driving portion, the locking structure being detachably locked on the holding portion to fix the handle at the mounting position when the handle pivots to the mounting position.

9. The server apparatus of claim 1, wherein the transmission member slides relative to the holding portion in a first direction to pivot the first link for rotating the first engaging structure to be engaged with the first fixing structure when the handle pivots to the mounting position, the transmission member slides relative to the holding portion in a second direction to pivot the first link for rotating the first engaging structure to be disengaged from the first fixing structure when the handle pivots to the releasing position, and the first direction is opposite to the second direction.

10. The server apparatus of claim 1, wherein the first driven portion has a pillar slidably disposed through the first slot.

11. A tray mechanism applied to assembly of at least one electronic module and a casing, the casing having an opening and a first fixing structure away from the opening, the tray mechanism comprising:
   a tray having a holding portion, the at least one electronic module being disposed on the holding portion;
   a transmission member slidably disposed on the tray along a longitudinal center line of the holding portion, the transmission member having a front portion and a rear portion, the rear portion having a first slot;
   a first link having a first shaft portion and a first driven portion, the first shaft portion being pivoted to the holding portion and having a first engaging structure, the first driven portion being slidably disposed through the first slot; and
   a handle having a pivot portion and a driving portion movably connected to the front portion, the pivot portion being pivoted to a corner area of the holding portion to make a pivotal connection position of the handle and the holding portion away from the transmission member at a lateral distance relative to the longitudinal center line and make the handle pivotable between a releasing position and a mounting position relative to the tray, the transmission member sliding relative to the holding portion with pivoting of the handle to the mounting position via the pivot portion to pivot the first link for rotating the first engaging structure to be engaged with the first fixing structure.

12. The tray mechanism of claim 11 further comprising:
a transmission link pivoted to the driving portion and the front portion respectively to make the driving portion drive the transmission link to slide via pivoting of the transmission link.

13. The tray mechanism of claim 11, wherein the driving portion has a driving slot, a connection sheet portion extends from the front portion toward the driving slot, the connection sheet portion has a driven pillar corresponding to the driving slot, the driven pillar is movably disposed through the driving slot, and when the handle pivots to the mounting position, the driven pillar slides along the driving slot to make the transmission member slide relative to the holding portion with pivoting of the handle.

14. The tray mechanism of claim 11, wherein the casing further has a second fixing structure opposite to the first fixing structure, the rear portion has a second slot, and the tray mechanism further comprises:
a second link having a second shaft portion and a second driven portion, the second shaft portion being pivoted to the holding portion and having a second engaging structure, the second driven portion being slidably disposed through the second slot;
wherein when the handle pivots to the mounting position, the first slot and the second slot drive the first link and the second link to rotate relative to the holding portion via the first driven portion and the second driven portion respectively, for rotating the first engaging structure and the second engaging structure to be engaged with the first fixing structure and the second fixing structure respectively, so as to move the tray to be fixed on the casing.

15. The tray mechanism of claim 11 further comprising:
a torsion spring structure connected to the pivot portion and the holding portion, for providing an elastic force to drive the handle to pop out relative to the tray.

16. The tray mechanism of claim 15, wherein an arc-shaped slot is formed on the holding portion, and the torsion spring structure comprises:
a bridge sheet fixed to the pivot portion and having a protruding member, the protruding member being movably disposed through the arc-shaped slot; and
a torsion spring connected to the holding portion and the protruding member respectively;
wherein when the handle pivots inward relative to the tray, the bridge sheet pivots with the pivot portion to slide the protruding member along the arc-shaped slot for biasing the torsion spring.

17. The tray mechanism of claim 11 further comprising:
a front panel disposed on the holding portion corresponding to the opening, the handle being detachably locked on the front panel to be fixed at the mounting position when the handle pivots to the mounting position.

18. The tray mechanism of claim 11 further comprising:
a locking structure connected to the driving portion, the locking structure being detachably locked on the holding portion to fix the handle at the mounting position when the handle pivots to the mounting position.

19. The tray mechanism of claim 11, wherein the transmission member slides relative to the holding portion in a first direction to pivot the first link for rotating the first engaging structure to be engaged with the first fixing structure when the handle pivots to the mounting position, the transmission member slides relative to the holding portion in a second direction to pivot the first link for rotating the first engaging structure to be disengaged from the first fixing structure when the handle pivots to the releasing position, and the first direction is opposite to the second direction.

20. The tray mechanism of claim 11, wherein the first driven portion has a pillar slidably disposed through the first slot.

* * * * *